United States Patent
Jung et al.

(10) Patent No.: US 7,852,694 B2
(45) Date of Patent: Dec. 14, 2010

(54) SEMICONDUCTOR MEMORY DEVICE FOR REDUCING PRECHARGE TIME

(75) Inventors: Jong-hoon Jung, Seoul (KR); Gyu-hong Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 234 days.

(21) Appl. No.: 12/155,885

(22) Filed: Jun. 11, 2008

(65) Prior Publication Data

US 2008/0310243 A1 Dec. 18, 2008

(30) Foreign Application Priority Data

Jun. 12, 2007 (KR) .................. 10-2007-0057306

(51) Int. Cl.
*G11C 7/00* (2006.01)
(52) U.S. Cl. ...................... 365/203; 365/202
(58) Field of Classification Search .......... 365/203, 365/202

See application file for complete search history.

(56) References Cited

U.S. PATENT DOCUMENTS 5,408,438 A * 4/1995 Tanaka et al. ............... 365/203
7,099,217 B2 * 8/2006 Haga et al. .................. 365/205

FOREIGN PATENT DOCUMENTS

| KR | 2000-0009542 | 6/2000 |
|----|--------------|--------|
| KR | 102001009472 | 11/2001 |
| KR | 102004004917 | 6/2004 |
| KR | 10-2007-0044697 | 4/2007 |

OTHER PUBLICATIONS

Korean Office Action dated May 30, 2008.

* cited by examiner

*Primary Examiner*—Son Dinh
*Assistant Examiner*—Nam Nguyen
(74) *Attorney, Agent, or Firm*—Harness, Dickey & Pierce, P.L.C.

(57) ABSTRACT

A semiconductor memory device for reducing a precharge time is provided. The semiconductor memory device may include a sense amplifier, a precharge unit and an equalizing circuit. The sense amplifier may sense and amplify a difference between data transmitted through a first bit line and data transmitted through a second bit line in response to a sense amplifier enable signal. The precharge unit may precharge voltage levels of the first bit line and the second bit line to a precharge voltage level in response to a precharge enable signal. The equalizing circuit may be connected to the sense amplifier and the precharge unit and may control the voltage levels of the first bit line and the second bit line to be equal to each other in response to the sense amplifier enable signal. The semiconductor memory device may reduce a time required to perform a precharge operation and/or minimize an increase of the circuit size.

20 Claims, 4 Drawing Sheets

US 7,852,694 B2

SEMICONDUCTOR MEMORY DEVICE FOR REDUCING PRECHARGE TIME

PRIORITY STATEMENT

This application claims the benefit under 35 U.S.C. §119 of Korean Patent Application No. 10-2007-0057306, filed on Jun. 12, 2007, in the Korean Intellectual Property Office, the entire contents of which are incorporated herein by reference.

FIELD

Example embodiments relate to a semiconductor memory device and, more particularly, to a semiconductor memory device for reducing a precharge time.

BACKGROUND

Description of the Related Art

Semiconductor memory devices may perform an active operation for reading or writing cell data of a memory and a precharge operation for preparing the next active operation after the active operation. More specifically, in a read operation of outputting data stored in a memory cell of a memory cell array, wordlines may be activated after a predetermined lapse of time when an active command is applied to a semiconductor memory device. When a bit line pair is selected according to a column select signal, the data may be transmitted through the selected bit line pair. A sense amplifier may be enabled in order to sense and amplify a voltage level difference between bit lines of the bit line pair. When the data is output according to the read operation, the semiconductor memory device performs a precharge operation for the next active operation. For example, the semiconductor memory device carries out the precharge operation when the voltage level difference between the bit lines of the bit line pair increases according to the sense amplifier, and thus a time required to perform the precharge operation increases.

To solve this problem, a local precharging method may be used. The local precharging method may include a second precharge unit in addition to a first precharge unit of a conventional circuit and a controller for controlling the second precharge unit. In this case, a precharge operating speed is improved but a circuit area increases. The controller may control the second precharge signal using a signal obtained by performing a logic operation on a signal for controlling a sense amplifier and a signal for controlling the first precharge unit, and thus the controller may require a logic gate for performing the logic operation. This may increase the circuit area.

SUMMARY

Example embodiments may provide a semiconductor memory device for reducing a precharge time and/or minimizing an increase of a circuit area.

Example embodiments may provide a semiconductor memory device including a sense amplifier, a precharge unit and an equalizing circuit. The sense amplifier may sense and amplify a difference between data transmitted through a first bit line and data transmitted through a second bit line in response to a sense amplifier enable signal. The precharge unit may precharge voltage levels of the first bit line and the second bit line to a precharge voltage level in response to a precharge enable signal. The equalizing circuit may be connected to the sense amplifier and the precharge unit and may control the voltage levels of the first bit line and the second bit line to be equal to each other in response to the sense amplifier enable signal.

The equalizing circuit may be an NMOS transistor having a gate to which the sense amplifier enable signal is applied, a first terminal connected to the first bit line and a second terminal connected to the second bit line.

The NMOS transistor may be turned on when the sense amplifier is disabled.

The equalizing circuit may be disabled when the sense amplifier enable signal is in a first logic state and enabled when the sense amplifier enable signal is in a second logic state.

The sense amplifier may be enabled when the sense amplifier enable signal is in a first logic state and disabled when the sense amplifier enable signal is in a second logic state.

The precharge unit may be enabled when the precharge enable signal is in a first logic state and disabled when the precharge enable signal is in a second logic state.

The semiconductor memory device may further include a switching unit connected to the precharge unit and the equalizing circuit. The switching unit may determine whether data applied to the first bit line and data applied to the second bit line are transmitted in response to a switch enable signal.

The switching unit may be disabled while the sense amplifier operates and may not transmit the data. The switch enable signal may have an inverted form of the sense amplifier enable signal.

The semiconductor memory device may be a static random access memory (SRAM).

Example embodiments may also provide a semiconductor memory device outputting data through a kth bit line pair (k is a natural number equal to or greater than 1 and smaller than or equal to n) from among first through nth bit line pairs (n is a natural number), which comprises a sense amplifier, first through nth precharge units, first through nth switching unit and an equalizing circuit. The sense amplifier may sense and amplify a difference between data transmitted through a bit line of the kth bit line pair and data transmitted through the other bit line of the kth bit line pair in response to a sense amplifier enable signal. The first through nth precharge units respectively precharge voltage levels of the first through nth bit line pairs to a precharge voltage level in response to a precharge enable signal. The first through nth switching units may be respectively connected to the first through nth precharge units and may output the data transmitted through the kth bit line pair in response to first through nth switch enable signals, respectively. The equalizing circuit may be connected to the sense amplifier and the first through nth switching units and may control the voltage levels of the bit lines of the kth bit line pair to be equal to each other in response to the sense amplifier enable signal.

The equalizing circuit may be an NMOS transistor having a gate to which the sense amplifier enable signal may be applied, a first terminal and a second terminal to which the bit lines of the kth bit line pair are respectively connected.

BRIEF DESCRIPTION OF THE DRAWINGS

The above and other features and advantages of example embodiments will become more apparent by describing in detail example embodiments with reference to the attached drawings in which.

DETAILED DESCRIPTION

Figure 1:
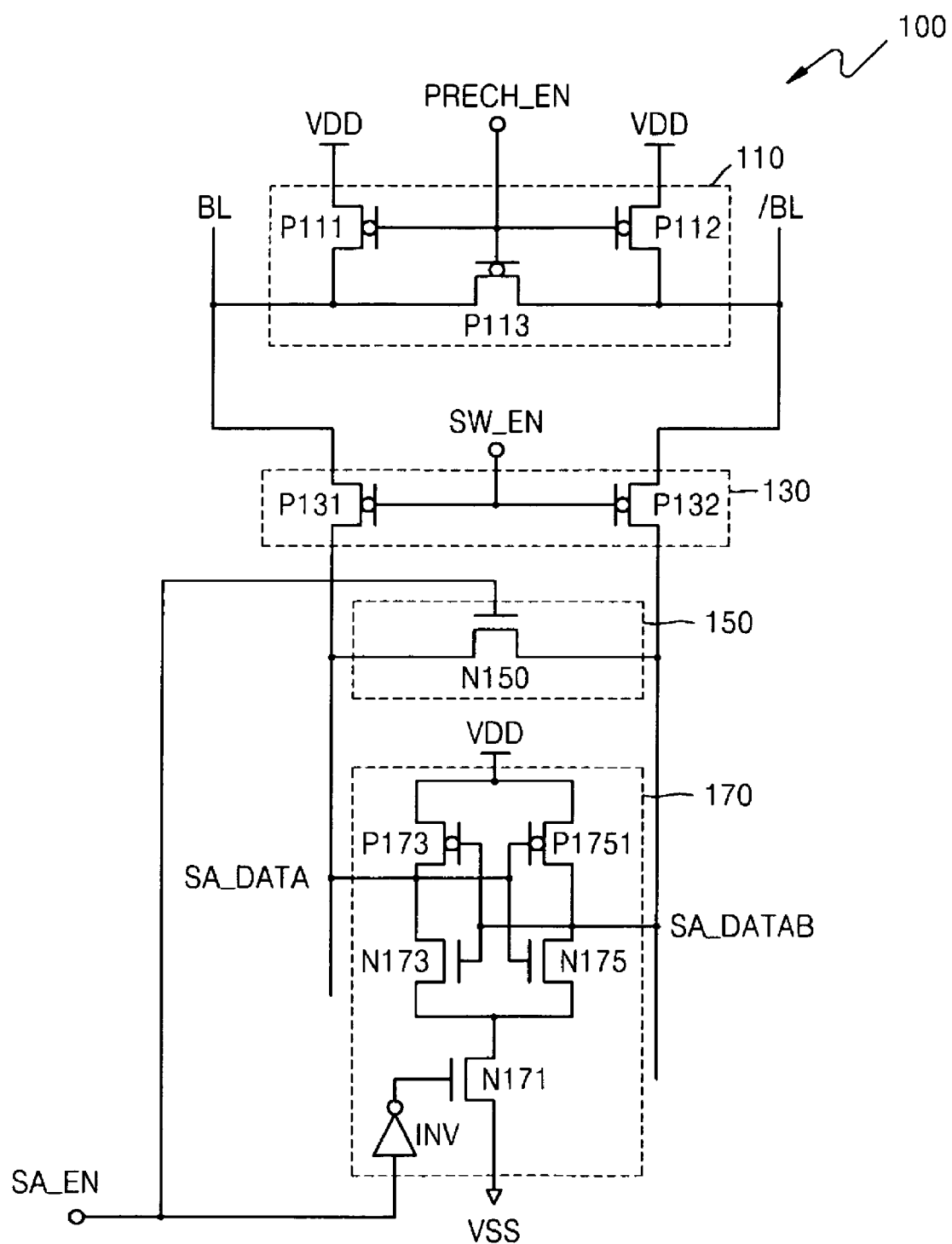
FIG. 1 is an example circuit diagram of a semiconductor memory device according to example embodiments.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the example embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Throughout the drawings, like reference numerals refer to like elements.

FIG. 1 is a circuit diagram of a semiconductor memory device 100 according to example embodiments. Referring to FIG. 1, the semiconductor memory device 100 may include a precharge unit 110, a switching unit 130, an equalizing circuit 150 and a sense amplifier 170.

The sense amplifier 170 may sense and amplify a difference between data transmitted through a first bit line BL and data transmitted through a second bit line /BL in response to a sense amplifier enable signal SA_EN and outputs data signals SA_DATA and SA_DATAB. The sense amplifier 170 may include an inverter INV inverting the sense amplifier enable signal SA_EN and an NMOS transistor N171 receiving the output signal of the inverter INV through its gate and determining whether the sense amplifier 170 is enabled. The sense amplifier 170 may further include a PMOS transistor P173 having a first terminal to which a power supply voltage VDD is applied, an NMOS transistor N173 having a first terminal connected to a second terminal of the PMOS transistor P173 and a second terminal connected to the NMOS transistor N171. The sense amplifier 170 may also include a PMOS transistor P175 having a first terminal to which the power supply voltage VDD is applied, and an NMOS transistor N175 having a first terminal connected to a second terminal of the PMOS transistor P175 and a second terminal connected to the NMOS transistor N171. Gates of the NMOS transistor N173 and the PMOS transistor P173 may be connected to each other and gates of the NMOS transistor N175 and the PMOS transistor P175 may be connected to each other. It will be understood by those of ordinary skill in the art that the circuit of the sense amplifier 170 illustrated in FIG. 1 is an example embodiment and may have a configuration different from the configuration illustrated in FIG. 1 if the configuration may allow the sense amplifier 170 to sense and amplify a data difference.

The precharge unit 110 may precharge voltage levels of the first bit line BL and the second bit line /BL to a predetermined precharge voltage in response to a precharge enable signal PRECH_EN. More specifically, the precharge unit 110 may include transistors P111 and P112 performing a precharge operation and a transistor P113 carrying out an equalizing operation. The precharge enable signal PRECH_EN may be applied to gates of the transistors P111, P112 and P113 and a precharge voltage VDD may be applied to first terminals of the transistors P111 and P112. Second terminals of the transistors P111 and P112 may be connected to first and second terminals of the transistor P113, respectively. The first bit line BL may be connected to the second terminal of the transistor P111 and the second bit line /BL may be connected to the second terminal of the transistor P112. The transistors P111, P112 and P113 may be PMOS transistors.

The switching unit 130 may be disabled while the sense amplifier operates to prevent data from being transmitted through the first bit line BL and the second bit line /BL. The switching unit 130 may include transistors P131 and P132 may be turned on or turned off in response to a switch enable signal SW_EN. The transistors P131 and P132 may be PMOS transistors.

The equalizing circuit 150 may control the voltage levels of the first bit line BL and the second bit line /BL to be equal to each other in response to the sense amplifier enable signal SA_EN. The equalizing circuit 150 may be an NMOS transistor N150 having a gate to which the sense amplifier enable signal SA_EN is applied, a first terminal connected to the first bit line BL and a second terminal connected to the second bit line /BL.

Figure 2:
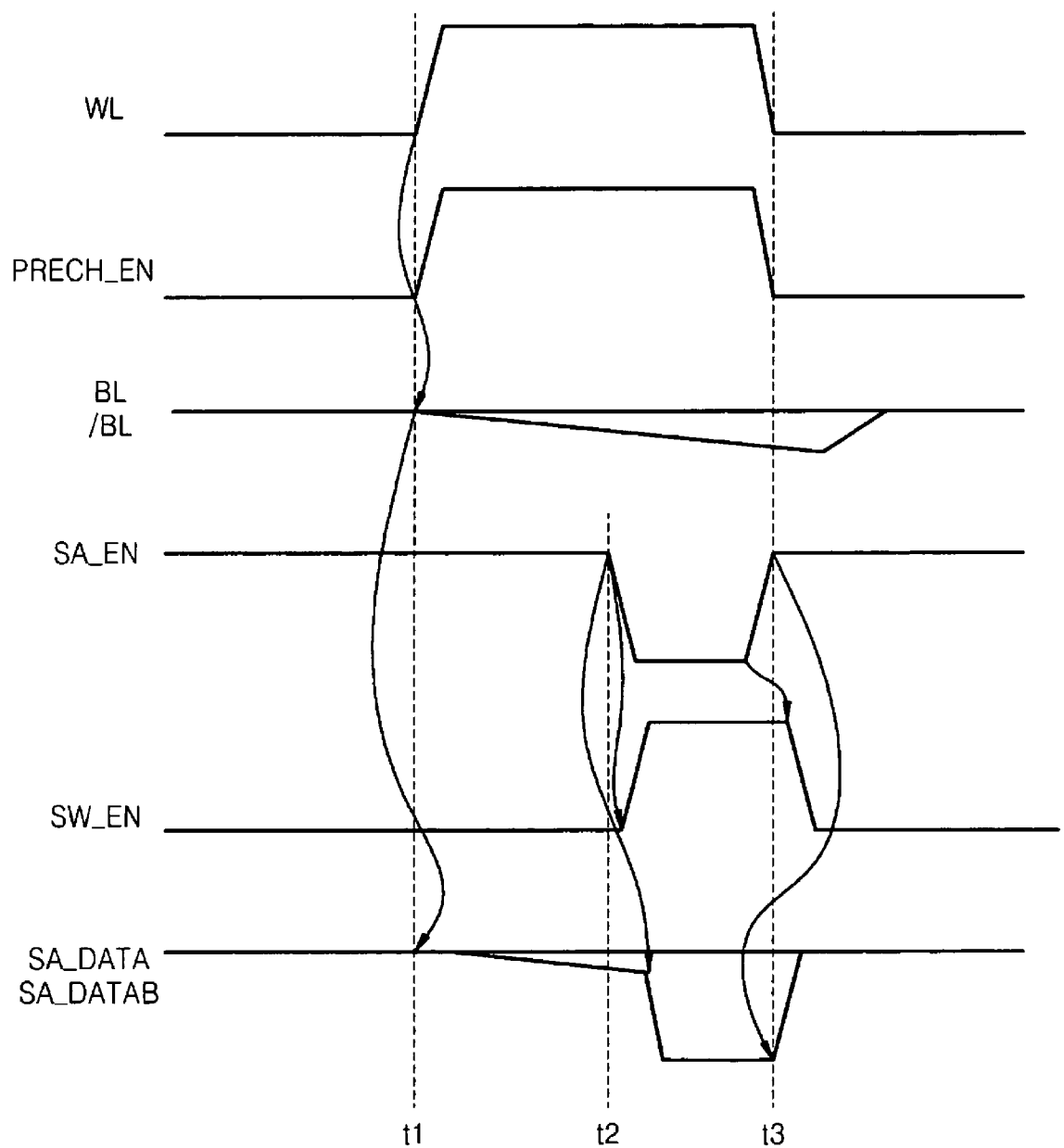
FIG. 2 is an example waveform diagram illustrating the operation of the semiconductor memory device illustrated in FIG. 1.

The operation of the semiconductor memory device 100 illustrated in FIG. 1 may be explained with reference to FIG. 2. Referring to FIGS. 1 and 2, the semiconductor memory device 100 may perform a precharge operation for an active operation until a time t1. The precharge enable signal PRE- CH_EN may start to transition from a first logic state to a second logic state because the precharge operation must be stopped when wordlines are enabled at the time t1. The first logic state may correspond to a logic low state and the second logic state may correspond to a logic high state in example embodiments. When the precharge enable signal PRE-CH_EN transitions to a second logic state, the transistors P11, P112 and P113 of the precharge unit 110 may be all turned off, and thus the precharge unit 110 may cease the precharge operation. The switching unit 130 may be in an enabled state because the switch enable signal SW_EN maintains a first logic state even after the time t1. At this time, data may start to be transmitted through the first bit line BL and the second bit line /BL, and thus the voltage levels of the first bit line BL and the second bit line /BL may become different from each other.

At a time t2, the sense amplifier enable signal SA_EN may transition from a second logic state to a first logic state, and thus the NMOS transistor N171 may be turned on and the sense amplifier 170 may start to operate. For example, the sense amplifier 170 may sense and amplify a difference between the data transmitted through the first bit line BL and the data transmitted through the second bit line /BL after the time t2. Accordingly, a voltage level difference between the output data signals SA_DATA and SA_DATAB may abruptly increase with the lapse of the time t2. Furthermore, the switch enable signal SW_EN may transition from the first logic state to a second logic state in synchronization with the sense amplifier enable signal SA_EN at the time t2 because the switching unit 130 must be disabled while the sense amplifier 170 operates. The switch enable signal SW_EN may have an inverted form of the sense amplifier enable signal SA_EN and thus a signal obtained by inverting the sense amplifier enable signal SA_EN through an inverter may be used as the switch enable signal SW_EN.

The sense amplifier enable signal SA_EN in the second logic state may be applied to the gate of the NMOS transistor N150 of the equalizing circuit 150 because the sense amplifier enable signal SA_EN maintains the second logic state until the time t2. However, the NMOS transistor N150 may not be turned on because the difference between the voltage levels of the first bit line BL and the second bit line /BL is very small. The NMOS transistor N150 may be turned off even though the sense amplifier enable signal SA_EN in a second logic state is applied to the gate of the NMOS transistor N150 because a gate-source voltage Vgs of the NMOS transistor N150 is lower than the threshold voltage Vth of the NMOS transistor N150.

When the sense amplifier enable signal SA_EN transitions to a first logic state after the lapse of the time t2, the sense amplifier 170 may enable and amplify the voltage level difference between the output data signals SA_DATA and SA_DATAB. The amplification operation of the sense amplifier 170 may be finished at a time t3. After the time t3, the sense amplifier enable signal SA_EN may transition to a second logic state, and thus the sense amplifier 170 is disabled and the switch enable signal SW_EN may transition to a first logic state to turn on the switching unit 130. According to example embodiments, the precharge enable signal PRE-CH_EN may transition to a first logic state and the precharge unit 110 may perform a precharge operation. At the time t3, the equalizing circuit 150 may be turned on because the sense amplifier enable signal SA_EN is in a second logic state and the voltage level difference between the output data signals SA_DATA and SA_DATAB is large. Since the sense amplifier 170 may largely decrease the voltage level of the second bit line /BL, the gate-source voltage Vgs of the NMOS transistor N150 becomes higher than the threshold voltage Vth of the NMOS transistor N150, and thus the NMOS transistor N150 may be turned on. Accordingly, the equalizing circuit 150 may be enabled at the time t3 and may start to control the voltage levels of the first bit line BL and the second bit line /BL to be equal to each other. The precharge circuit 100 may start to perform a precharge operation after a predetermined lapse of time from the time t3. Therefore, the semiconductor memory device 100, according to example embodiments, may more rapidly precharge the voltage levels of the first bit line BL and the second bit line /BL.

Figure 3:
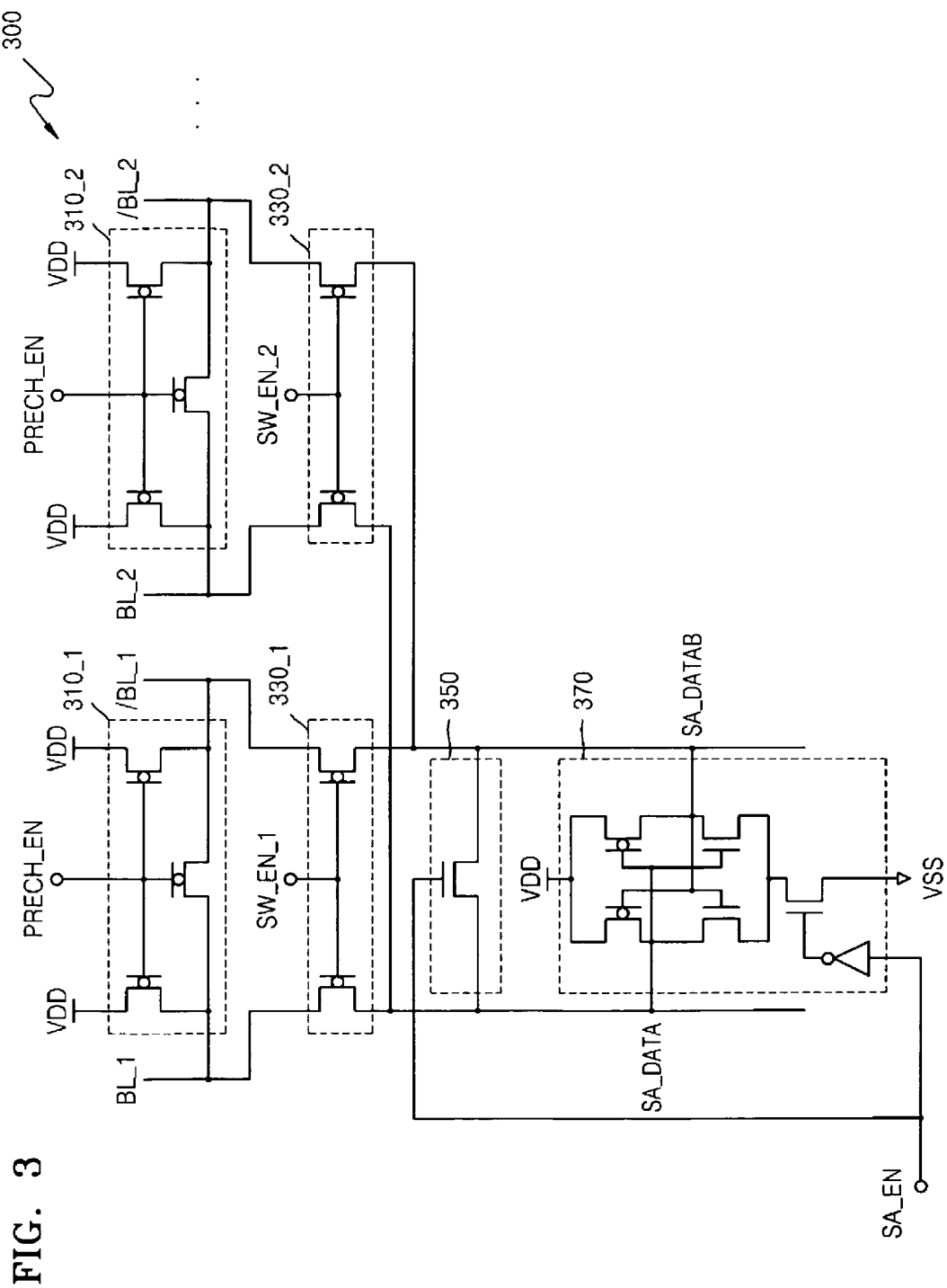
FIG. 3 is an example circuit diagram of a semiconductor memory device according to example embodiments.

FIG. 3 is a circuit diagram of a semiconductor memory device 300 according to example embodiments. Referring to FIG. 3, the semiconductor memory device 300 may include a plurality of precharge units 310_1, 310_2, ..., a plurality of switching units 330_1, 330_2, ..., an equalizing circuit 350 and a sense amplifier 370.

In example embodiments, the semiconductor memory device 300 may include first through nth (n is a natural number) precharge units 310_1 through 310_n, first through nth switching units 330_1 through 330_n. The first through nth precharge units 310_1 through 310_n and the first through nth switching units 330_1 through 330_n may be respectively connected to first through nth bit line pairs BL_1 and /BL1 through BL_n and /BL_n, and data may be output through the first bit line pair BL_1 and /BL_1.

The second through nth switching units 330_2 through 330_n may be all turned off because data is output through the first bit line pair BL_1 and /BL1, and thus second through nth switch enable signals SW_EN_2 through SW_EN_n maintain a second logic state. The second through nth switching units 330_2 through 330_n may be all disabled and a first switch enable signal SW_EN_1 may have the same waveform as the switch enable signal SW_EN illustrated in FIG. 2. Accordingly, the operation of the semiconductor memory device 300 may correspond to the operation of the semiconductor memory device 100 illustrated in FIG. 1 so that explanation thereof is omitted.

While the data may be output through the first bit line pair BL_1 and /BL_1, switching units 330_1, ..., 330_k–1, 330_k+1, ..., 330_n other than a kth switching unit 330_k (k is a natural number greater than 1 and smaller than n) may be disabled when data is output through a kth bit line pair BL_k and /BL_k.

Figure 4:
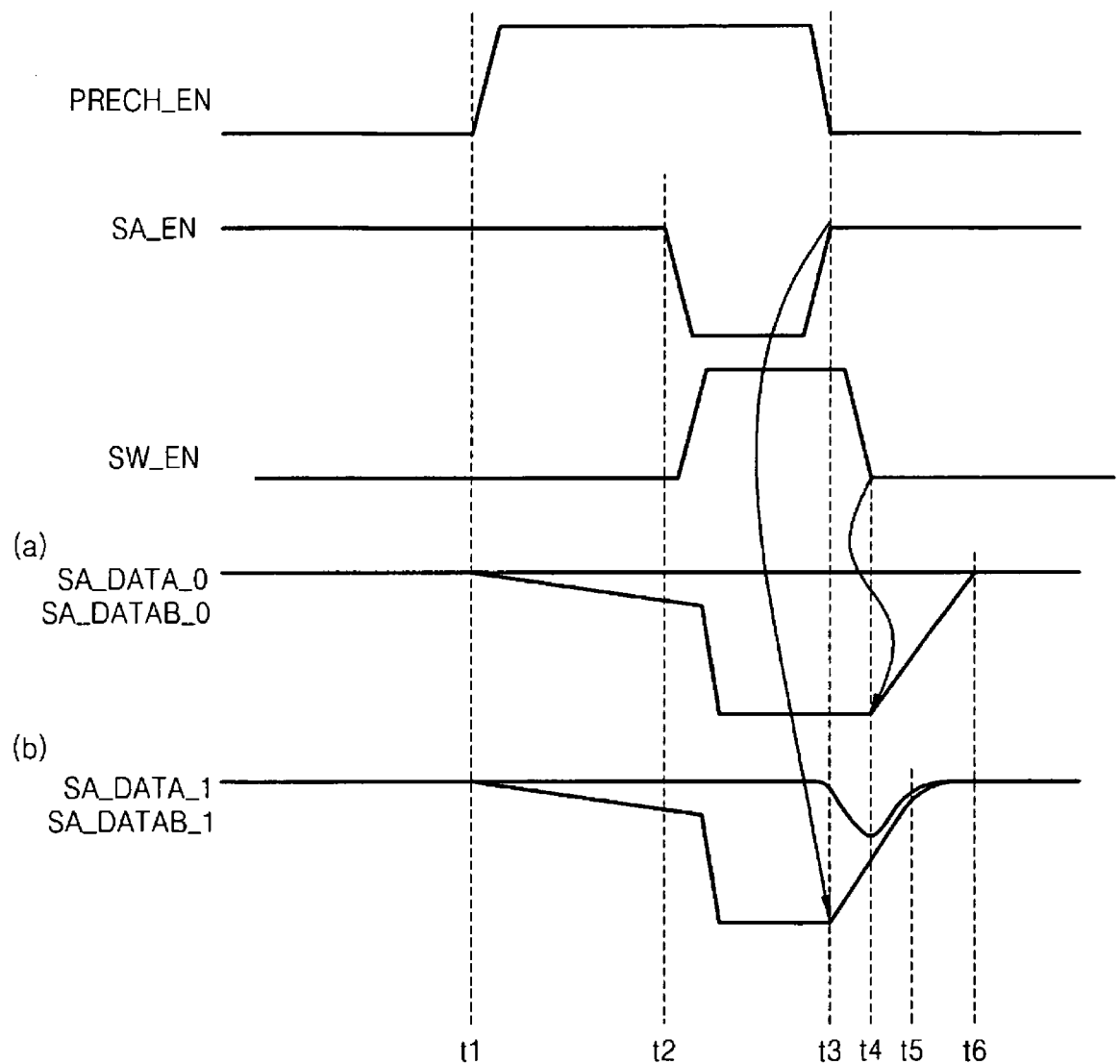
FIG. 4 is an example waveform diagram for comparing a precharge time of the semiconductor memory device illustrated in FIG. 1 according to example embodiments to a precharge time of a conventional semiconductor memory device.

FIG. 4 is a waveform diagram for comparing a precharge time of the semiconductor memory device 100 illustrated in FIG. 1 according to example embodiments to a precharge time of a conventional semiconductor memory device. A precharge signal PRECH_EN, a sense amplifier enable signal SA_EN and a switching enable signal SW_EN illustrated in FIG. 4 may have the same waveforms as those of the precharge signal PRECH_EN, the sense amplifier enable signal SA_EN and the switching enable signal SW_EN illustrated in FIG. 2 so that explanations thereof are omitted.

In FIG. 4, (a) may represent output data signals SA_DATA_0 and SA_DATAB_0 of a sense amplifier of the conventional semiconductor memory device and (b) may represent output data signals SA_DATA_1 and SA_DATAB_1 of the sense amplifier of the semiconductor memory device 100 illustrated in FIG. 1 and may illustrate the waveforms of the output data signals SA_DATA and SA_DATAB of the sense amplifier illustrated in FIG. 2 in more detail.

In the conventional semiconductor memory device, a precharge unit may not perform a precharge operation after a switching unit is enabled and a signal obtained by inverting the sense amplifier enable signal SA_EN through an inverter is used as the switch enable signal SW_EN. Thus, the switch enable signal SW_EN may transition to a first logic state at a time t4 after a predetermined lapse of time from a time t3 when the sense amplifier enable signal SA_EN transitions to a second logic state. Accordingly, the conventional semiconductor memory device may perform a precharge operation from the time t4 when the switch enable signal SW_EN transitions to the first logic state. In the semiconductor memory device 100 illustrated in FIG. 1 according to an example embodiment, however, the equalizing circuit 150 may be enabled at the time t3 in response to the sense amplifier enable signal SA_EN, not the switching enable signal SW_EN, and thus the voltage level of the first bit line BL_1 may start to decrease and the voltage level of the second bit line /BL_1 may start to increase at the time t3. At the time t4, the voltage levels of the first bit line BL_1 and the second bit line /BL_1 may increase together because the switching unit 130 is enabled and the precharge unit 110 performs a precharge operation in response to the switch enable signal SW_EN. Accordingly, the semiconductor memory device 100 illustrated in FIG. 1 according to example embodiments may complete the precharge operation at a time t5 while the conventional semiconductor memory device may finish the precharge operation at a time t6. A time required for the precharge operation of the semiconductor memory device according to example embodiments may be shorter than a time required for the precharge operation of the conventional semiconductor memory device. Furthermore, the semiconductor memory device according to example embodiments may not require a controller for controlling the additional second precharge unit used in the aforementioned conventional local precharging method. The semiconductor memory device according to example embodiments may operate the equalizing circuit in response to the sense amplifier enable signal SA_EN without using an additional control signal. Thus, an increase of a circuit area of the semiconductor memory device may be minimized.

The semiconductor memory device according to example embodiments may be a static random access memory (SRAM).

As described above, the semiconductor memory device according to example embodiments may reduce a precharge time and/or minimize an increase of a circuit area.

While example embodiments have been particularly shown and described with reference to the drawings, it will be understood by those of ordinary skill in the art that various changes in form and details may be made therein without departing from the spirit and scope of the example embodiments as defined by the following claims.

What is claimed is:

1. A semiconductor memory device comprising:
   a sense amplifier sensing and amplifying a difference between data transmitted through a first bit line and data transmitted through a second bit line in response to a sense amplifier enable signal;
   at least one precharge unit precharging voltage levels of the first bit line and the second bit line to a precharge voltage level in response to a precharge enable signal; and
   an equalizing circuit connected to the sense amplifier and the precharge unit and controlling the voltage levels of the first bit line and the second bit line to be equal to each other in response to the sense amplifier enable signal.

2. The semiconductor memory device of claim 1, wherein the equalizing circuit is an NMOS transistor having a gate to which the sense amplifier enable signal is applied, a first terminal connected to the first bit line and a second terminal connected to the second bit line.

3. The semiconductor memory device of claim 2, wherein the NMOS transistor is turned on when the sense amplifier is disabled.

4. The semiconductor memory device of claim 1, wherein the equalizing circuit is disabled when the sense amplifier enable signal is in a first logic state and enabled when the sense amplifier enable signal is in a second logic state.

5. The semiconductor memory device of claim 1, wherein the sense amplifier is enabled when the sense amplifier enable signal is in a first logic state and disabled when the sense amplifier enable signal is in a second logic state.

6. The semiconductor memory device of claim 1, wherein the precharge unit is enabled when the precharge enable signal is in a first logic state and disabled when the precharge enable signal is in a second logic state.

7. The semiconductor memory device of claim 1, further comprising a switching unit connected to the precharge unit and the equalizing circuit, wherein the switching circuit determines whether data applied to the first bit line and data applied to the second bit line is transmitted in response to a switch enable signal.

8. The semiconductor memory device of claim 7, wherein the switching unit is disabled while the sense amplifier operates and does not transmit the data.

9. The semiconductor memory device of claim 7, wherein the switch enable signal is an inverted form of the sense amplifier enable signal.

10. The semiconductor memory device of claim 1, wherein the semiconductor memory device is a static random access memory (SRAM) device.

11. The semiconductor memory device of claim 1, configured to output data through a k-th bit line pair (k is a natural number equal to or greater than 1 and smaller than or equal to n) from among first through n-th bit line pairs (n is a natural number), wherein the semiconductor memory device further comprises:
   first through n-th switching units respectively connected to the first through n-th precharge units and outputting the data transmitted through the k-th bit line pair in response to first through n-th switch enable signals respectively; and wherein
   the sense amplifier senses and amplifies a difference between data transmitted through a bit line of the k-th bit line pair and data transmitted through the other bit line of the k-th bit line pair in response to the sense amplifier enable signal;
   the at least one precharge unit includes first through n-th precharge units respectively precharging voltage levels of the first through n-th bit line pairs to a precharge voltage level in response to the precharge enable signal; and
   the equalizing circuit is connected to the sense amplifier and the first through n-th switching units and controls the voltage levels of the bit lines of the k-th bit line pair to be equal to each other in response to the sense amplifier enable signal.

12. The semiconductor memory device of claim 11, wherein the equalizing circuit is an NMOS transistor having a gate to which the sense amplifier enable signal is applied, a first terminal and a second terminal to which the bit lines of the k-th bit line pair are respectively connected.

13. The semiconductor memory device of claim 12, wherein the NMOS transistor is turned on when the sense amplifier is disabled.

14. The semiconductor memory device of claim 11, wherein the equalizing circuit is disabled when the sense amplifier enable signal is in a first logic state and enabled when the sense amplifier enable signal is in a second logic state.

15. The semiconductor memory device of claim 11, wherein the sense amplifier is enabled when the sense amplifier enable signal is in a first logic state and disabled when the sense amplifier enable signal is in a second logic state.

16. The semiconductor memory device of claim 11, wherein the first through n-th precharge unit are enabled when the precharge enable signal is in a first logic state and disabled when the precharge enable signal is in a second logic state.

17. The semiconductor memory device of claim 11, wherein a k-th switching unit from among the first through n-th switching units is enabled in periods other than a period in which the sense amplifier operates and switching units other than the k-th switching unit maintain a disabled state.

18. The semiconductor memory device of claim 11, wherein a k-th switch enable signal from among the first through n-th switch enable signal is an inverted form of the sense amplifier enable signal.

19. The semiconductor memory device of claim 11, wherein the semiconductor memory device is a static random access memory (SRAM) device.

20. The semiconductor memory device of claim 1, configured to output data through a k-th bit line pair (k is a natural number equal to or greater than 1 and smaller than or equal to n) from among first through n-th bit line pairs (n is a natural number), wherein the semiconductor memory device further comprises:

first through n-th switching units respectively connected to the first through n-th precharge units and configured to output the data transmitted through the k-th bit line pair in response to first through n-th switch enable signals respectively, and wherein the at least one precharge unit includes first through n-th precharge units configured to respectively precharge voltage levels of the first through n-th bit line pairs to a precharge voltage level in response to the precharge enable signal, and the equalizing circuit is connected to the sense amplifier and the first through n-th switching units and configured to control the voltage levels of the bit lines of the k-th bit line pair to be equal to each other in response to the sense amplifier enable signal.

* * * * *